United States Patent [19]

Lee et al.

[11] Patent Number: 4,968,580
[45] Date of Patent: Nov. 6, 1990

[54] PROCESS FOR PRODUCING PHOTOSENSITIVE COMPOSITION CAPABLE OF FORMING FULL COLOR IMAGES FROM A SINGLE CAPSULE BATCH

[75] Inventors: Chuan Lee; Kerry Kovacs, both of Centerville, Ohio

[73] Assignee: The Mead Corporation, Dayton, Ohio

[21] Appl. No.: 467,093

[22] Filed: Jan. 18, 1990

Related U.S. Application Data

[62] Division of Ser. No. 218,717, Jul. 13, 1988, Pat. No. 4,929,531.

[51] Int. Cl.$^5$ .................... G03C 1/68; B41M 5/12; B41M 5/18
[52] U.S. Cl. ..................... 430/138; 428/402.2; 428/402.21; 428/402.24; 503/215
[58] Field of Search ................. 430/138; 428/402.2, 428/402.21, 403.24; 252/174.3; 503/214, 215

[56] References Cited

U.S. PATENT DOCUMENTS

| | | | |
|---|---|---|---|
| 4,138,362 | 2/1979 | Vassiliades et al. | 428/402.2 |
| 4,353,809 | 10/1982 | Hoshi et al. | 503/215 |
| 4,576,891 | 3/1986 | Adair et al. | 430/138 |
| 4,778,781 | 10/1988 | Washizu et al. | 503/215 |
| 4,783,438 | 11/1988 | Okada et al. | 503/215 |

FOREIGN PATENT DOCUMENTS

| | | | |
|---|---|---|---|
| 159990 | 12/1980 | Japan | 503/215 |
| 169281 | 7/1986 | Japan | 503/215 |

Primary Examiner—Paul R. Michl
Assistant Examiner—Patrick A. Doody
Attorney, Agent, or Firm—Thompson, Hine and Flory

[57] ABSTRACT

A method for forming a full color photosensitive material in a single batch and the material produced thereby is disclosed. The method includes dispersing three internal phases, each containing a different color-forming agent in a continuous solution to form an emulsion, and thereafter forming mirocapsule walls around each of the internal phases. The invention is particularly characterized by the use of an agent to control intermixing of the internal phases.

13 Claims, No Drawings

PROCESS FOR PRODUCING PHOTOSENSITIVE COMPOSITION CAPABLE OF FORMING FULL COLOR IMAGES FROM A SINGLE CAPSULE BATCH

This is a division of application Ser. No. 07/218,717, filed Jul. 13, 1988, now U.S. Pat. No. 4,929,531.

BACKGROUND OF THE INVENTION

1. Field of the Invention

The present invention relates to a process for producing a photosensitive material capable of forming full color images, and more specifically, to a process for producing such material in a single batch.

2. Description of the Prior Art

Imaging systems employing photosensitive microcapsules are described in U.S. Pat. Nos. 4,399,209 and 4,440,846, assigned to The Mead Corporation. These patents teach the formation of images by the exposure-controlled release of an image-forming agent from a microcapsule containing a photohardenable composition. The image-forming agent is typically a substantially colorless color precursor which reacts with a developer to form a visible image.

U.S. patent application Ser. No. 339,917, filed Jan. 18, 1982 (corresponding to U.K. Pat. No. 2,113,860), and U.S. Pat. No. 4,576,891 disclose a full color imaging system wherein three sets of microcapsules which are sensitive to different bands of actinic radiation are employed. These microcapsules respectively contain cyan, magenta and yellow color precursors.

Panchromatic, full color, imaging systems wherein a panchromatic imaging sheet is exposed to visible light and subsequently developed are described in European Application No. 0233567.

To produce the full color imaging systems described above, three sets of microcapsules containing respectively cyan, magenta and yellow color precursors have independently been formed, mixed together, and coated onto a substrate. The three sets of capsules are mixed in amounts such that the combination of the three produces a neutral black image when developed. See, for example, Example 4, U.S. Pat. No. 4,576,891.

Although the above-described inventions have significantly advanced imaging technology, the inventions still suffer from minor drawbacks. For example, when producing a full color photosensitive material according to the prior art teachings, three independent batches of microcapsules, each batch containing a specific color former and a specific photosensitive composition must be prepared, filtered, and subsequently mixed together to form the photosensitive coating composition. As a result, independent storage facilities for containing each of the different color-forming microcapsules must be maintained and plant mixing and filtration equipment must be cleaned between each capsule batch preparation or separate manufacturing facilities must be maintained. Furthermore, increased processing costs result because of the numerous manufacturing steps involved. Moreover, the requirement of preparing three independent batches of microcapsules before forming the photosensitive composition causes the composition to be more susceptible to instability as a result of potential contamination to any of the independent microcapsule batches. Contamination to any of the batches can be caused by, for example, contaminated process equipment.

Accordingly, there exists a need in the art for improved methods for producing photosensitive microcapsule compositions capable of forming full color images.

BRIEF SUMMARY OF THE INVENTION

In accordance with the present invention, a photosensitive composition capable of forming full color images is produced in a single capsule batch.

The process for producing the photosensitive composition includes the steps of: providing an agitating continuous phase; dispersing a first internal phase comprising a first color-forming agent and a first photohardenable or photosoftenable composition in the continuous phase to form droplets of said first internal phase in said continuous phase; dispersing a second internal phase comprising a second color-forming agent and a second photohardenable or photosoftenable composition in the continuous phase to form droplets of said second internal phase in said continuous phase; dispersing a third internal phase comprising a third color-forming agent and a third photohardenable or photosoftenable composition in the continuous phase to form droplets of said third internal phase in said continuous phase; and forming discrete microcapsule walls around the droplets of each of the first, second and third internal phases; wherein each of the first, second and third color-forming agents is different and in combination are capable of producing full color images upon reaction with a developer material and wherein said first, second and third internal phases are dispersed in said continuous phase in the presence of an agent which controls droplet intermixing.

In the preferred embodiment, the color-forming agents are cyan, magenta and yellow color-forming agents and the photosensitive composition comprises a polyethylenically unsaturated monomer and a photoinitiator. Imaging is conducted as described in the aforementioned commonly assigned patents and applications.

Another embodiment of the present invention resides in a photosensitive composition capable of forming full color images. The composition includes a first set of color-forming microcapsules having a first internal phase comprising a first color-forming agent and a first photohardenable or photosoftenable composition; a second set of color-forming microcapsules having a second internal phase comprising a second color-forming agent and a second photohardenable or photosoftenable composition; and a third set of color-forming microcapsules having a third internal phase comprising a third color-forming agent and a third photohardenable or photosoftenable composition; wherein the photosensitive composition is produced by the above defined single batch process.

In the preferred embodiment, the microcapsules contain cyan, magenta and yellow color-forming agents respectively. It has further been surprisingly discovered that by manipulating process conditions, the contrast of microcapsules can range from high contrast to low contrast (high continuous tone). Accordingly, the quality of the contrast of the image produced can be controlled as a result of the manufacture of microcapsules.

Still another embodiment of the present invention resides in a photosensitive material capable of forming full color images. The material includes a substrate having front and back surfaces and a coating of the above-defined photosensitive composition located on either the front or back surface of the substrate. To produce full color images, the photosensitive material is image-wise exposed to actinic radiation and is contacted with a developer material, typically by the application of pressure.

DETAILED DESCRIPTION OF THE PREFERRED EMBODIMENTS

In describing the preferred embodiments, certain terminology will be utilized for the sake of clarity. The use of such terminology encompasses not only the recited embodiments, but all technical equivalents which perform substantially the same function in substantially the same way to produce the same result.

In accordance with the present invention, a photosensitive composition capable of forming full color images is produced in a single batch process. The process includes the step of providing a continuous phase. In most common encapsulation processes, the continuous phase is aqueous and an oil in water emulsion is used for producing the inventive photosensitive composition.

The aqueous phase preferably includes agents known as emulsifiers and system modifiers to control the size and uniformity of the microcapsules and to produce individual mononuclear capsules in preference to clusters of microcapsules. Useful emulsifiers and system modifiers are well known in the art. Their selection will depend on the type of microencapsulation process used and the nature of the wall formers. For making melamine-formaldehyde microcapsules a combination of methylated polygalacturonic acid and sulfonated polystyrenes is preferred. The polygalacturonic acid acts as a stabilizer for the aqueous phase, and the sulfonated polystyrenes aid in emulsification.

Methylated polygalacturonic acids having a methylation degree greater than 50% are generally available. The preferred polygalacturonic acids have a methylation degree between 40 and 70% and still more preferably between 55 and 65%. However, acids having a methylation degree less than 40% or greater than 70% are also believed to be useful.

The most typical examples of useful acids are commonly known as pectins. Since pectin is a naturally occurring product, its composition will vary with the season and the source from which it is derived. As a result of this variation, some pectins will provide better microcapsules than others. Methylated polygalacturonic acid is generally added to the aqueous phase in an amount of about 1.0 to 8% based on the amount of water in the aqueous phase, with the preferred amount being about 2 to 4%.

Typical examples of sulfonated polystyrenes useful in the present invention are Versa TL500 and Versa TL502B, products of National Starch Co. Useful sulfonated polystyrenes are generally characterized by a sulfonation degree of over 85% and preferably over 95%. The molecular weight of the sulfonated polystyrene is preferably greater than 100,000 and more preferably about 500,000 but other molecular weights can also be used. The sulfonated polystyrene is usually added to the aqueous phase in an amount of about 1 to 6% by weight. The quality of this product has also been found to vary with the method by which it is manufactured such that certain sulfonated polystyrenes are better than others.

Various color-forming agents can be used in the internal phase. For example, images can be formed by the interaction of color formers and color developers of the type conventionally used in the carbonless paper art. In addition, images can be formed by the color producing interaction of a chelating agent and a metal salt or by the reaction of certain oxidation-reduction reaction pairs, many of which have been investigated for use in pressure-sensitive carbonless papers. Alternatively, an oil soluble dye can be used and images can be formed by transfer to plain or treated paper. The internal phase itself has its own image-forming capability. For example, it is known that many of the toners used in xerographic recording processes selectively adhere to the image areas of an imaging sheet exposed and developed as in the present invention. When dispersing the three internal phases it is preferable that each internal phase contain a different color-forming agent. In the preferred embodiment, the three internal phases contain cyan color-forming agents, magenta color-forming agents, and yellow color-forming agents respectively.

Furthermore, it is speculated that the color-forming agent can be provided inside the microcapsules, in the microcapsule wall, or outside the microcapsules in the same layer as the microcapsules or in a different layer. In the latter cases, it is hypothesized that each color-forming agent would be associated with a separate photopolymerizable monomer and the internal phase would pick up each color-forming agent (e.g., by dissolution) upon being released from the microcapsules and carry each color-forming agent to the developer layer or an associated developer sheet.

Typical color-forming agents useful in the aforesaid embodiments include colorless electron donating type compounds. Representative examples of such color formers include substantially colorless compounds having in their partial skeleton a lactone, a lactam, a sulfone, a spiropyran, an ester or an amido structure such as triarylmethane compounds, bisphenylmethane compounds, xanthene compounds, fluorans, thiazine compounds, spiropyran compounds and the like. Cyan, magenta and yellow color precursors useful in the present invention are commercially available.

A positive working photohardenable or a negative working photosoftenable radiation sensitive composition is also present in the dispersed internal phases. Photohardenable compositions such as photopolymerizable and photocrosslinkable materials increase in viscosity or solidify upon exposure to radiation and yield positive images.

Ethylenically unsaturated organic compounds are useful radiation curable materials. These compounds contain at least one terminal ethylene group per molecule. Typically, they are liquid. Polyethylenically unsaturated compounds having two or more terminal ethylene groups per molecule are preferred. An example of this preferred subgroup is ethylenically unsaturated acid esters of polyhydric alcohols, such as trimethylol propane triacrylate (TMPTA) and dipentaerythritol hydroxypentaacrylate (DPHPA).

The internal phase also typically include a photoinitiator. A preferred photoinitiator system for use in the present invention includes ionic dye-counter ion compounds described in European Application Publication No. 0 233 587. A preferred class of ionic dye-counter ions is cationic dye borates and still more particularly cyanine dye borates. Typically the borate is a triphenylalkyl borate such as a triphenylbutyl borate. Other dye complexes such as Rose Bengal iodonium and Rose Bengal pyryllium complexes may also be used.

Examples of other photoinitiators useful in the present invention include diaryl ketone derivatives, quinones and benzoin alkyl ethers. Where ultraviolet sensitivity is desired, suitable photoinitiators include alkoxy phenyl ketones, O-acylated oximinoketones, polycyclic quinones, phenanthrenequinone, naphthoquinone, diisopropylphenanthenequinone, benzophenones and substituted benzophenones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones and haloalkanes. In many cases it is advantageous to use a combination with imaging photoinitiators.

Initiators including the ionic dye complexes may preferably include an autoxidizer. Suitable examples include N,N,-dialkylanilines as described in the European Publication.

In preparing microcapsules by this single batch process, it is preferable that the droplets of the first, second and third internal phases not intermix or intermix slightly during emulsification. When the amount of intermixing is maintained at a minimum level, the contrast of the microcapsules produced is high. However, for some applications, a more continuous tone image may be desired. To produce a more continuous tone image, some droplet intermixing should occur and can be promoted by altering process parameters as would be readily understood by one skilled in the art. By controlling the amount of droplet intermixing, images ranging from high contrast to continuous tone may be produced.

Droplet intermixing can be minimized through the use of a number of techniques. One way to prevent intermixing is to form a pre-wall material around the individual internal phase droplets by adding a compound to the internal phase which reacts with a constituent of the continuous phase to form a pre-wall. For example, a polyisocyanate may be added to the internal phase. This practice is described in detail in U.S. Pat. No. 4,353,809. The polyisocyanate is believed to react with water and other nucleophiles at the interface of the internal phase in the aqueous medium and form a thin layer of a polyurethane polymer around the internal phase. The formation of the polyurethane pre-wall around the internal phase prevents the internal phase from mixing with the subsequently added second and third internal phases. Moreover, the formation of the pre-wall material further stabilizes the emulsion.

A particularly preferred polyisocyanate useful in the internal phases is Desmodur N-100, a biuret of hexamethylene diisocyanate and water available from Mobay Chemical Company. Other isocyanates, such as SF-50, may be used in this invention. The isocyanate is typically added in an amount of about 0.005 to 20 parts per 100 parts of the first internal phase and preferably 0.01 to 5 parts.

After the first internal phase has been dispersed in the continuous phase and a pre-wall has formed around the first internal phase, the second and third internal phases are then sequentially added to the continuous phase. It is necessary for the internal phases to be added sequentially so that the pre-wall can form around the added phases without significant cross-contamination occuring from other internal phases.

Formation of the pre-walls preferably occurs by the addition of an isocyanate to the individual internal phases. Control of the formation of the pre-walls may be obtained by varying the amounts of isocyanate added to the individual internal phases or by altering the pH of the emulsion for each sequential addition. For example, since the addition of the internal phases are sequential, it is preferable that the pre-walls form rapidly around the first internal phase so that the subsequently added internal phases can be introduced shortly thereafter. This can be accomplished by adding larger amounts of isocyanates to the earlier added internal phases. Similarly, it is hypothesized that if the pH of the emulsion were increased or decreased for a given internal phase introduction, various rates of pre-wall formation could occur. These parameters can be altered to produce microcapsules capable of producing images ranging from high contrast to continuous tone.

At this stage in the process, the aqueous phase constitutes the continuous phase of an oil in water emulsion containing three dispersed separate non-reactive internal phases. Microcapsules are then formed around each of the first, second and third internal phases.

The discrete walled microcapsules formed around the first, second and third internal phases in the present invention can be produced using known encapsulation techniques including coacervation, in situ polymerization, interfacial polymerization, polymerization of one or more monomers in an oil, etc. Representative examples of suitable wall-formers are gelatin materials (see U.S. Pat. Nos. 2,730,456 and 2,800,457 to Green et al.) including gum arabic, polyvinyl alcohol, carboxy-methyl-cellulose; resorcinol-formaldehyde wall formers (see U.S. Pat. No. 3,755,190 to Hart et al.); isocyanate wall-formers (see U.S. Pat. No. 3,914,511 to Vassiliades); isocyanate-polyol wall-formers (see U.S. Pat. No. 3,796,669 to Kiritani et al.); urea-formaldehyde wall-formers, particularly urea-resorcinol-formaldehyde in which olephilicity is enhanced by the addition of resorcinol (see U.S. Pat. Nos. 4,001,140; 4,087,376 and 4,089,802 to Foris et al.); and melamine-formaldehyde resin and hydroxypropyl cellulose (see commonly assigned U.S. Pat. No. 4,025,455 to Shackle). A melamine-formaldehyde capsule is particularly preferred.

The mean microcapsule size used in the present invention generally ranges from about 1 to 25 microns.

In the preferred embodiment, melamine-formaldehyde capsule walls surrounding the first, second and third internal phases are produced by in situ condensation of formaldehyde and melamine or a pre-condensate thereof. Formation of the melamine-formaldehyde capsule walls is obtained by adding solutions of melamine and formaldehyde or a solution of a precondensate thereof to the oil and water emulsion. Melamine-formaldehyde walls form over a period of time around each of the first, second and third internal phase droplets.

The condensation reaction proceeds under acid conditions, e.g., pH of 7 or less; however, the reaction is preferably carried out at a pH in the range of 2.5 to 6.0. The temperature of the encapsulation medium should be maintained at about 10° to 90° C., preferably about 25° to 85° C. and more preferably about 45° to 75° C.

The melamine and formaldehyde are preferably present in the encapsulation medium, whether as a free monomer or as a precondensate, in a molar ratio of formaldehyde to melamine of at least 1.5 and preferably 2.0 to 3.0.

To reduce malodor and the incidence of skin irritation, when the polymerization reaction is complete, it is desirable to remove or react the excess formaldehyde. This can be accomplished by using any one of several known techniques such as the addition of urea, sulfite, bisulfite, ammonium salts, 2-imidazolidone, ethylene-n-methylolacrylamide-vinylacetate copolymer, defatted soybean powder, isobutylene/maleic anhydride copolymer/ammonium salt, 5-methylbenzimidazole, dimethyloldihydroxyethyleneurea, carbohydrazide, water insoluble amino group containing polymers such as Amberlite IR45, 2-oxazolidone and dihydroxyacetone (dimer form). These materials react with the formaldehyde to form a product which does not interfere with the performance of the medium. The addition of the urea or sodium sulfite to scavenge formaldehyde is preferably performed in a single step after encapsulation and prior to storage. The pH and temperature of the medium should be adjusted for this reaction. The sulfite is preferably reacted at a pH of 6 to 9 from room temperature to 85° C. for about two hours. The urea can be reacted at a pH of 5 to 8 at a temperature of 20°-85° C. for about one hour.

To produce an imaging sheet capable of providing full color images, the inventive photosensitive composition is coated onto a substrate. The most common substrate for imaging sheets in accordance with this invention is a transparent film or paper. The paper may be a commercial impact raw stock, or special grade paper such as cast-coated paper or chrome-rolled paper. The latter two papers are preferred when using microcapsules having a diameter between approximately 1 and 5 microns because the surface of these papers is smoother and therefore the microcapsules are not as easily embedded in the stock fibers. Transparent substrates such as polyethylene terephthalate and translucent substrates can also be used in this invention. Another preferred substrate for the microcapsules is aluminized polyethylene terephthalate. The microcapsules can be located on either the top or bottom surface of a transparent substrate to form an imaging sheet.

To form a full color image, the inventive substrate is exposed to actinic radiation such that the microcapsules are image-wise exposed. Typically, exposure of the microcapsules to actinic radiation (ultraviolet, visible or infrared wavelengths) causes the internal phase of each of the three sets of microcapsules to polymerize, thereby preventing escape of the image-forming agent from the imaging sheet. Thereafter, the microcapsules on the imaging sheet are subjected to a uniform rupturing force in the presence of a developer material to form full color images.

In an additional embodiment, it is hypothesized that the inventive photosensitive composition may include an encapsulated fourth color-forming agent, more particularly, a black color-forming agent. To produce such a photosensitive composition, before the capsule forming step, a fourth internal phase, containing a black color-forming agent and a photohardenable or photosoftenable composition is dispersed in the aqueous phase. The fourth internal phase does not intermix with either of the first, second or third internal phases.

As is demonstrated in the examples, the continuous tone of the images produced can be controlled and is primarily dependent on the amount of droplet intermixing. When microcapsules are produced having a relatively high continuous tone (some intermixing present), these microcapsules can be mixed with three separate batches of cyan, yellow and magenta microcapsules having a high contrast to extend the dynamic range of the resultant composition. Conversely, if high contrast images are desired, the amount of droplet intermixing during emulsification should be maintained at a minimum level.

The present invention is illustrated in more detail by the following non-limiting examples:

EXAMPLE 1

The following yellow color-forming internal phase was emulsified in an aqueous phase containing 430 grams $H_2O$, 8 grams Versa TL502B (sulfonated polystyrene), 12.65 grams pectin and 0.24 grams sodium bicarbonate at 40° C. at 3000 rpm over a period of 25 minutes:

Trimethylolpropane triacrylate (TMPTA): 47.35 grams
7-diethylamino-3-cinnamoylcoumarin: 0.28 grams
Diisopropyl Dimethylaniline (DIDMA): 0.48 grams
Reakt Yellow 186 (BASF): 5.67 grams
Desmodur N-100 Isocyanates: 3.38 grams The emulsion was stirred for five minutes. Thereafter, the following magenta color-forming internal phase was dispersed into the emulsion while maintaining a temperature of 40° C. under the same stirring conditions:

TMPTA: 37.5 grams
1,1'-di-n-heptyl-3,3,3',3'-tetramethylindocarbocyanine triphenyl-n-butylborate: 0.14 grams
DIDMA: 0.39 grams
HD-5100 (Magenta color precursor from Hilton Davis): 8.57 grams
Desmodur N-100 Isocyanates: 2.38 grams The emulsion was stirred for five minutes. Thereafter, the following cyan color-forming internal phase was dispersed into the emulsion at 40° C. under the same stirring conditions:

TMPTA: 46.94 grams
Dipentaerythritol hydroxypentaacrylate (DPHPA): 20.13 grams
1,1'-di-n-pentyl-3,3,3',3'-tetramethylindodicarbocyanine triphenyl-n-butylborate: 0.54 grams
DIDMA: 0.67 grams
HD-5430 (Cyan color precursor from Hilton Davis): 8.05 grams
Desmodur N-100 Isocyanates: 4.45 grams To this emulsion was added 246 grams of melamine-formaldehyde wall former and the emulsion was stirred at 1500 rpm for 70 minutes until encapsulation of each internal phase was complete. The solution produced contained encapsulated yellow color-former, encapsulated magenta color-former and encapsulated cyan color-former.

EXAMPLE 2

The composition produced in Example 1 was coated on a polyethylene terephthalate substrate. The substrate was image-wise exposed to broad band white light through a step wedge and the photosensitive material was developed in the contact with a developer sheet by exerting pressure on the substrate to cause the unexposed microcapsules to rupture and migrate to the developer sheet. The photographic properties of the photosensitive composition were as follows:

$D_{max}$: 1.893
$D_{min}$: 0.046
Dynamic range: 5.99 steps
$D_{90}$ (speed at density of 90% of Dmax): 13.98 (step number)
$D_{10}$ (speed at density of 10% of Dmax): 7.99 (step number)

The image produced had an excellent soft facial tone (high continuous tone) but was slightly dull.

COMPARATIVE EXAMPLE 1

Three sets of microcapsules, the first set containing the yellow color-former internal phase defined in Example 1, the second set containing the magenta color-former internal phase defined in Example 1, and the third set containing the cyan color-former internal phase defined in Example 1 were individually prepared as described in U.S. application Ser. No. 128,292, filed Dec. 3, 1987. The three sets of microcapsules were mixed together to form a full color photosensitive composition. The composition was coated on a polyethylene terephthalate substrate, the substrate was imagewise exposed to broad band white light through a step wedge and the photosensitive material was developed in contact with a developer sheet by applying pressure on the substrate to cause the unexposed microcapsules to rupture and migrate to the developer sheet. The photographic properties of the photosensitive composition were as follows:

$D_{max}$: 1.791
$D_{min}$: 0.039
Dynamic range: 4.00 steps
$D_{90}$: 14.52 (step number)
$D_{10}$: 10.52 (step number)

In comparison to Example 2, the images produced were bright and had a high contrast.

EXAMPLE 3

A photosensitive composition was formed by mixing 8% by weight of the composition of Example 1 and 92% by weight of the composition of Comparative Example 1. The resulting mixture was coated on a polyethylene terephthalate substrate, the substrate was image-wise exposed to broad band white light through a step wedge and the photosensitive material was developed in contact with a developer sheet by applying pressure on the substrate to cause the unexposed microcapsules to rupture and migrate to the developer. The photographic properties of the photosensitive composition were as follows:

$D_{max}$: 1.958
$D_{min}$: 0.032
Dynamic range: 4.77 steps
$D_{90}$: 14.79 (step number)
$D_{10}$: 10.02 (step number)

The tone of the produced image was not as continuous as the tone of the image produced in Example 2 but more continuous than the tone of the image produced in Comparative Example 1.

EXAMPLE 4

A photosensitive composition was formed by mixing 20% by weight of the composition of Example 1 and 80% by weight of the composition of Comparative Example 1. The resulting mixture was coated on a polyethylene terephthalate substrate, the substrate was image-wise exposed to broad band white light through a step wedge and the photosensitive material was developed in contact with a developer sheet by applying pressure on the substrate to cause the unexposed microcapsules to rupture and migrate to the developer. The photographic properties of the photosensitive composition were as follows:

$D_{max}$: 1.870
$D_{min}$: 0.042
Dynamic range: 5.31 steps
$D_{90}$: 14.63 (step number)
$D_{10}$: 9.32 (step number)

The tone of the produced image was not as continuous as the tone of the image produced in Example 2 but more continuous than the tone of the images produced in Comparative Example 1 and Example 3.

Thus, the present invention enables the production of a full color photosensitive material in one capsule batch. This enables superior quality control, as well as reduces processing and equipment costs for preparing the photosensitive material. Further, by maintaining control over droplet intermixing, the photosensitive composition is capable of producing images ranging from high contrast to high continuous tone. This provides a great deal of latitude from which a photochemist can produce images of desired tones.

Having described the invention in detail and by reference to preferred embodiments thereof, it will be apparent that modifications and variations are possible without departing from the scope of the invention defined in the appended claims.

What is claimed is:

1. A process for producing a photosensitive composition capable of forming full color images comprising the steps of:
    providing an agitating continuous phase;
    dispersing a first internal phase comprising a first color-forming agent and a first photohardenable or photosoftenable composition in said continuous phase to form droplets of said first internal phase in said continuous phase;
    dispersing a second internal phase comprising a second color-forming agent and a second photohardenable or photosoftenable composition in said continuous phase to form droplets of said second internal phase in said continuous phase;
    dispersing a third internal phase comprising a third color-forming agent and a third photohardenable or photosoftenable composition in said continuous phase to form droplets of said third internal phase in said continuous phase; and
    forming discrete microcapsule walls around said droplets of said first, second and third internal phases;
    wherein each of said first, second and third color-forming agents is different and in combination are capable of producing full color images upon reaction with a developer material and wherein said first, second and third internal phases are dispersed in said continuous phase in the presence of an agent which controls droplet intermixing.

2. The process according to claim 1 wherein said first color-forming agent comprises a cyan color-forming agent, said second color-forming agent comprises a magenta color-forming agent and said third color-forming agent comprises a yellow color-forming agent.

3. The process according to claim 2 wherein said first, second and third photohardenable or photosoftenable compositions comprise photohardenable compositions.

4. The process according to claim 3 wherein each of said photohardenable compositions comprise a free radical addition polymerizable or crosslinkable compound and a photoinitiator.

5. The process according to claim 2 wherein said forming step comprises forming microcapsule walls by a method selected from the group consisting of coacervation, interfacial polymerization, polymerization of one or more monomers in an oil, in situ polymerization, melting, dispersing and cooling.

6. The process according to claim 5 wherein said forming step comprises in situ polymerization.

7. The process according to claim 6 wherein said forming step forms amine-formaldehyde microcapsules.

8. The process according to claim 7 wherein said continuous phase is an aqueous phase and includes a methylated polygalacturonic acid and a sulfonated polystyrene.

9. The process according to claim 2 wherein said agent which controls droplet intermixing is a pre-wall former.

10. The process according to claim 9 wherein said agent is a polyisocyanate.

11. A photosensitive composition capable of forming full color images comprising:
   a first set of color-forming microcapsules having a first internal phase comprising a first color-forming agent and a first photohardenable or photosoftenable composition;
   a second set of color-forming microcapsules having a second internal phase comprising a second color-forming agent and a second photohardenable or photosoftenable composition; and
   a third set of color-forming microcapsules having a third internal phase comprising a third color-forming agent and a third photohardenable or photosoftenable composition;
   wherein said photosensitive composition is produced by a process comprising the steps of:
   providing an agitating continuous phase;
   dispersing a first internal phase comprising a first color-forming agent and a first photohardenable or photosoftenable composition in said continuous phase to form droplets of said first internal phase in said continuous phase;
   dispersing a second internal phase comprising a second color-forming agent and a second photohardenable or photosoftenable composition in said continuous phase to form droplets of said second internal phase in said continuous phase;
   dispersing a third internal phase comprising a third color-forming agent and a third photohardenable or photosoftenable composition in said continuous phase to form droplets of said third internal phase in said continuous phase; and
   forming discrete microcapsule walls around said droplets of said first, second and third internal phase;
   wherein each of said first, second and third color-forming agents is different and in combination are capable of producing full color images upon reaction with a developer material and wherein said first, second and third internal phases are dispersed in said continuous phase in the presence of an agent which controls droplet intermixing.

12. The composition according to claim 11 wherein said first color-forming agent comprises a cyan color-forming agent, said second color-forming agent comprises a magenta color-forming agent and said third color-forming agent comprises a yellow color-forming agent.

13. The composition according to claim 12 wherein said first, second and third photohardenable or photosoftenable compositions comprise photohardenable compositions, and wherein said photohardenable compositions comprise a free radical addition polymerizable or cross-linkable compound and a photoinitiator.

* * * * *